US008553900B2

(12) United States Patent
Cheah et al.

(10) Patent No.: US 8,553,900 B2
(45) Date of Patent: Oct. 8, 2013

(54) NOISE REDUCTION CIRCUIT WITH MONITORING FUNCTIONALITY

(75) Inventors: Chee Sin Cheah, Singapore (SG); Huoy Ru Rachel Koh, Singapore (SG); Boon Cheong Raymond Ng, Singapore (SG)

(73) Assignee: Creative Technology Ltd, Singapore (SG)

( * ) Notice: Subject to any disclaimer, the term of this patent is extended or adjusted under 35 U.S.C. 154(b) by 317 days.

(21) Appl. No.: 12/780,720

(22) Filed: May 14, 2010

(65) Prior Publication Data

US 2011/0280411 A1 Nov. 17, 2011

(51) Int. Cl.
*H03B 29/00* (2006.01)

(52) U.S. Cl.
USPC ........... 381/71.6; 381/71.1; 381/71.7; 381/74

(58) Field of Classification Search
USPC ................................ 381/71.1, 71.7, 74, 71.6
See application file for complete search history.

(56) References Cited

U.S. PATENT DOCUMENTS 7,171,009 B2 * 1/2007 Ohta ............................... 381/98
2002/0141599 A1 * 10/2002 Trajkovic et al. ............ 381/71.6
2003/0118197 A1 * 6/2003 Nagayasu et al. .............. 381/74
2005/0276421 A1 12/2005 Bergeron et al.
2007/0253569 A1 11/2007 Bose
2009/0245529 A1 * 10/2009 Asada et al. ................. 381/71.6
2010/0296666 A1 * 11/2010 Lin ............................. 381/71.6
2011/0038496 A1 * 2/2011 Lott et al. ...................... 381/309

* cited by examiner

*Primary Examiner* — Disler Paul

(74) *Attorney, Agent, or Firm* — Creative Technology Ltd

(57) ABSTRACT

A noise reduction circuit 200 for a headphone 100 is disclosed herein. In a described embodiment, the headphone 100 includes a speaker driver 110 and the circuit 200 comprises a microphone 112 configured to convert ambient sound into a corresponding electrical ambient signal and which is disposed adjacent to the speaker driver's diaphragm. The circuit 200 further includes an active noise reduction path configured to provide active noise reduction of the ambient sound based on the corresponding electrical ambient signal and a vocal signal compensation path configured to restore attenuated signals within the vocal range of the corresponding electrical ambient signal to increase audibility of vocal signals of the ambient sound. The circuit 200 also includes a switching device 204,210 arranged to selectively deliver the corresponding electrical ambient signal to the active noise reduction path or to the vocal signal compensation path.

13 Claims, 5 Drawing Sheets

NOISE REDUCTION CIRCUIT WITH MONITORING FUNCTIONALITY

BACKGROUND AND FIELD OF THE INVENTION

This invention relates to a noise reduction circuit with monitoring functionality, particularly but not exclusively for a headphone.

Headphones with passive noise reduction are usually equipped with ear cushions that completely enclose the ears (i.e. circumaural) and the cushions provide passive reduction or isolation from ambient noise. The extent of reduction is largely dependent on the nature of the ambient noise and the acoustics characteristics of ear cushions of the headphone. Due to the characteristics of the ear cushions, most passive noise reduction headphones attenuate the higher frequency components (approximately from 200 Hz and above) of the ambient noise, and the lower frequency components would still be heard by a user of the headphone. As a result, such passive headphones may not provide sufficient or effective noise reduction in certain noisy environments.

To address the above problem, active noise reduction circuits have been provided in headphones and such circuits are configured to eliminate or attenuate lower frequency components of the ambient noise to result in more effective noise attenuation. Ideally, ambient noise waveform is detected and an identical anti-noise waveform, which is equal in magnitude, but of opposite polarity is produced. Interaction of the noise waveform with the anti-noise waveform results in cancellation of the noise waveform.

It is an object of the present invention to provide a noise reduction circuit with monitoring function which provides a useful alternative to similar known circuits.

SUMMARY OF THE INVENTION

In a first aspect of the invention, there is provided a noise reduction circuit with monitoring functionality for a headphone having at least one speaker driver, the circuit comprising:

a microphone configured to convert ambient sound into a corresponding electrical ambient signal, the microphone being disposed adjacent to the speaker driver's diaphragm;

an active noise reduction path configured to provide active noise reduction of the ambient sound based on the corresponding electrical ambient signal;

a vocal signal compensation path configured to restore attenuated signals within the vocal range of the corresponding electrical ambient signal to increase audibility of vocal signals of the ambient sound; and a switching device arranged to selectively deliver the corresponding electrical ambient signal to the active noise reduction path or to the vocal signal compensation path.

Preferably, the vocal signal compensation path comprises a vocal clarity compensator configured to enhance the frequency response of the attenuated signal within the vocal range. The vocal clarity compensator may include a band pass filter and a signal amplifier coupled to the band pass filter's output. In an alternative, the vocal clarity compensator may include more than one band pass filter cascaded in parallel. In a further alternative, the vocal clarity compensator may include a high pass filter.

The frequency response may be dependent on both construction and design of earcups of the headphone, the frequency response being between 200 Hz and 1 KHz of the vocal range.

Preferably, the noise reduction circuit further comprises a microphone amplifier arranged to amplify the corresponding electrical ambient signal, and wherein the switching device is arranged to receive the amplified corresponding electrical ambient signal.

Advantageously, the active noise reduction path includes an active-noise cancellation filter. The microphone may be arranged to face the user. In addition, or as an alternative, the microphone may be arranged at the front of the speaker driver's diaphragm.

It is envisaged that the noise reduction circuit described above may be incorporated in a headphone, and this forms a second aspect of the invention.

BRIEF DESCRIPTION OF THE DRAWINGS

An embodiment of the invention will now be described, by way of example, with reference to the accompanying drawings in which.

DETAILED DESCRIPTION OF THE PREFERRED EMBODIMENT

Figure 1:
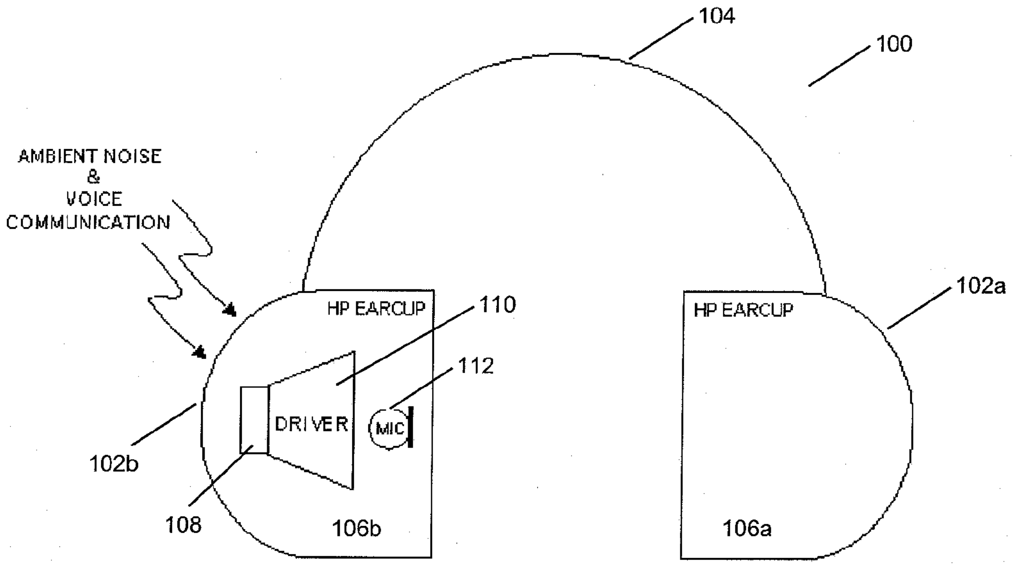
FIG. 1 is a schematic diagram of a headphone 100 including an active noise reduction circuit of the present invention.

FIG. 1 is a schematic diagram showing a headphone 100 including a pair of earcups 102*a*, 102*b* connected by a headband 104. Each earcup 102*a*, 102*b* includes an ear cushion 106*a*, 106*b* of circumaural type and is arranged to be fit around an ear. Each of the earcups 102*a*, 102*b* includes a speaker driver 108 (only one is shown in FIG. 1 to prevent clutter in the figure) having a diaphragm 110. The headphone 100 also includes an active noise reduction circuit 200 with monitoring functionality (not shown in FIG. 1) which includes a microphone 112. The microphone 112 is disposed adjacent the front of the diaphragm 110 and arranged to face the ear of a user. The microphone 112 is positioned to face the ear of the user so as to detect ambient noise which is audible to the ear of the user. Audio output emanating from the speaker driver 108 may be cancelled using phase inversion by the active noise cancellation circuit 200, the active noise cancellation circuit 200 being described in greater detail at a subsequent section of the description.

The microphone 112 is arranged in front of and in close proximity to the speaker driver's diaphragm 110 and arranged to face the ear so as to more accurately pick up the undesired ambient noise which would be picked up by the ear. During monitoring mode, the microphone 112 is also used to pick up desired ambient sound such as speech or voice communication. The preferred embodiment of the present invention will be described in greater detail such that the undesired ambient noise is accurately picked up and yet desired ambient sound is still satisfactorily compensated through the use of the microphone 112.

Figure 2:
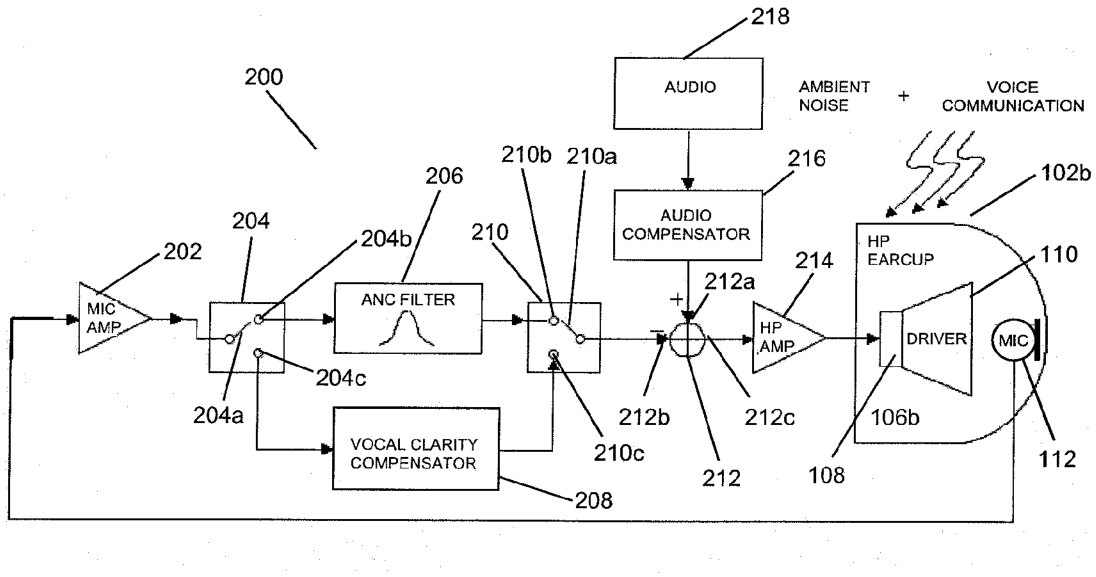
FIG. 2 is a block diagram showing the active noise reduction circuit of FIG. 1 which includes a vocal clarity compensator.

FIG. 2 is a block diagram of the active noise reduction circuit 200 incorporated within one of the earcups 102*b* of the headphone 100. The active noise reduction circuit 200 is housed within a casing of the earcup 102*b* and includes a microphone preamplifier 202, a first switching device 204, an Anti-Noise Cancellation (ANC) filter 206, a vocal clarity compensator 208, a second switching device 210, an adder 212 and a headphone amplifier 214.

As mentioned earlier, the microphone 112 is arranged to receive both undesired and desired sound waves. The microphone 112 converts this to electrical energy and provides this as a feedback signal to the microphone preamplifier 202 that boosts the gain of the feedback signal before passing the signal to the first switching device 204. The first switching device 204 includes a switch 204*a* and two connectors 204*b*, 204*c*. When the switch 204*a* makes contact with the first connector 204*b*, this creates an active noise reduction path for the boosted feedback signal to travel to the ANC filter 206. When the switch 204*a* makes contact with the second connector 204*c*, this creates a vocal signal compensation path for the boosted feedback signal to be directed to the vocal clarity compensator 208.

The ANC filter 206 is configured to compensate for inadequacies of the passive ear cushion 106*b* in cancelling low frequency components of the ambient noise. In this regard, the ANC filter 206 is arranged to filter and amplify the boosted feedback signal to allow the low frequency components of the undesired ambient sound (i.e. noise) to pass to the second switching device 210. The second switching device 210 may have a same configuration as the first switching device 204 and it comprises a switch 210*a* with two connectors 210*b*, 210*c*. When the switch 210*a* makes contact with the first connector 210*b*, this delivers the filtered feedback signal from the ANC filter 206 to the adder 212.

The adder 212 has two inputs 212*a*, 212*b* and an output 212*c* with the first input 212*a* configured as a positive polarity whereas the second input 212*b* is configured as a negative input. The first input 212*a* is connected to an audio compensator 216 which in turn is connected to an audio source 218, which delivers or streams audio signals, such as music or a sound track of a video, to the earcups 102*a*, 102*b*. As part of the audio source 218 may be distorted or lost (adversely affected in relation to quality) with the implementation of the active noise cancellation, the audio compensator 216 restores the audio input to its original waveform and provides this as an audio input to the first input 212*a* of the adder 212.

The second input 212*b* is connected to the second switching device 210 and in view of its negative polarity, this inverts the polarity of the filtered feedback signal from the ANC filter 206 to create an anti-noise signal. The output of the adder 212 is a combined signal comprising the audio input and the anti-noise signal which is then passed to the headphone amplifier 214. The headphone amplifier 214 is arranged to boost the gain of the combined signal for processing by the headphone driver 108. On receipt of the combined signal, the headphone driver 108 converts the combined signal into sound waves of the audio input and the anti-noise signal. The anti-noise signal is intended to cancel out the low frequency noise components picked up by the ear and which are not attenuated by the ear cushions 106*a*, 106*b*. In this way, active noise reduction or cancellation is achieved.

It is advantageous for the user of the headphone 100 to be able to listen to the ambient sound when required for example, when the user is engaged in a conversation with another person while using the headphone 100. This improves the ease of use and speech (conversational) audibility of the headphone 100. The first and second switching devices 204, 210 are used as a toggle to allow the user of the headphone 100 to select whether the feedback signal is to be delivered to either the active noise reduction path in which the ambient sound is blocked/reduced, or to the vocal signal compensation path in which the ambient sound, such as speech, is enhanced to increase the audibility to the user. Because of the location of the microphone 112, this creates difficulty for the microphone 112 to pick up desired ambient sound which is external to the headphone 100. However, this is addressed by the vocal clarity compensator 208.

The vocal clarity compensator 208 has an input connected to the second connector 204*c* of the first switching element 204 and an output connected to the second connector 210*c* of the second switching element 210. To activate the vocal clarity compensator 208, the user activates a monitor mode by selecting the switch 204*a* of the first switching device 204 and the switch 210*a* of the second switching device 210 to make contact with the second connectors 204*c* and 210*c* respectively. It should be appreciated that signals passing through the vocal clarity compensator 208 are out of phase, and thus the second switching element 210 is required such that signals passing through the audio compensator 216 and the signals passing through the vocal clarity compensator 208 are in phase.

Figure 3:
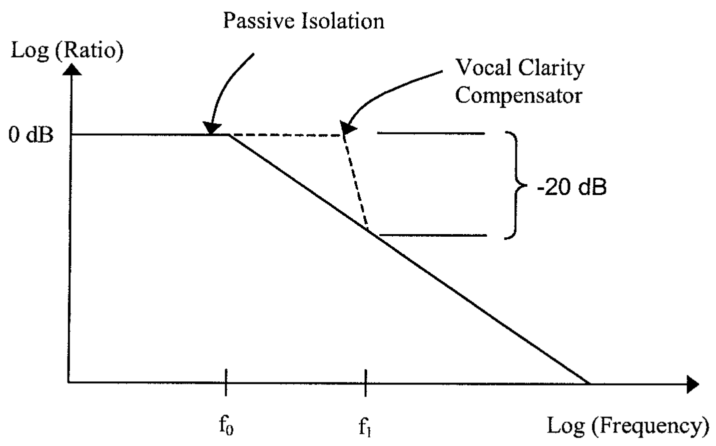
FIG. 3 shows a generic passive isolation frequency response provided by the headphone 100 of FIG. 1.

Configuration of the vocal clarity compensator 208 is based on a study of the passive isolation frequency response of the active noise reduction headphone 100 of FIG. 1. A generic passive isolation frequency response is shown in FIG. 3. The low frequency components of the ambient noise which are below $f_0$, are not blocked by the passive isolation (provided by the ear cushions 106*a*, 106*b*) of the earcups 102*a*, 102*b*. Higher frequency components above $f_0$ of the ambient noise are reduced tremendously by the passive isolation. At frequency $f_1$, the reduction in audio level may be −20 dB lower than the audio level at $f_0$. Human vocal range during normal conversation is typically between 90 Hz to 400 Hz. The fundamental voice frequency and its higher harmonics present a complete vocal profile of a person. Therefore, without the vocal voice compensator 208, it is not ideal for a normal conversation to take place when a user is using the headphone 100. For example, if the passive isolation starts attenuating only from 200 Hz, it is evident that only a portion of the human vocal range is heard and the speech will be unclear. As a result, the vocal clarity compensator 208 is configured to restore the attenuated level of the ambient noise between $f_0$ and $f_1$ to 0 dB (see broken line of FIG. 3) for audible speech during conversation to be received by the headphone 100 user.

Due to Helmholtz resonance, a typical feedback active noise cancellation headphone continuously produces high pitch noise at frequency $f_1$. It should be noted that values of $f_0$ and $f_1$ are dependent on both construction and design of the earcups 102*a*, 102*b*. However, it is highly likely that both the values of $f_0$ and $f_1$ will fall within the human vocal range of between 90 Hz to 400 Hz. Therefore, it should be appreciated that in the restoration of the vocal signal by the vocal clarity compensator 208, it is recommended for frequencies at $f_1$ and higher to be filtered off. For optimum performance, the vocal clarity compensator 208 operates in the region from $f_0$ to $f_1$ to restore the attenuated audio level. This effectively widens the audible frequency bandwidth to include the vocal range fundamental frequency and its second or third harmonics. As a result, this preserves the vocal range integrity and the user is able to enjoy a robust and clear conversation.

Figure 4:
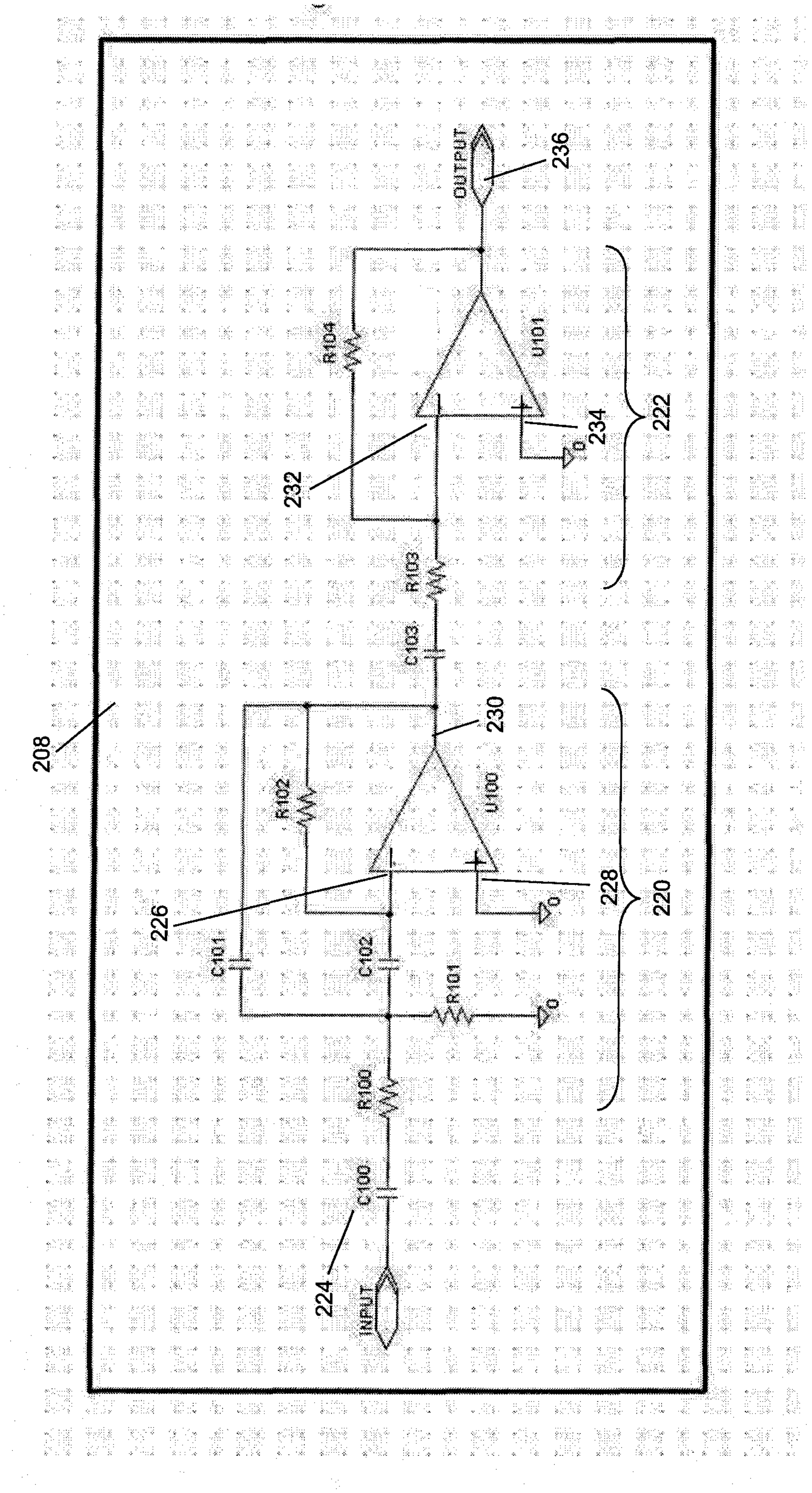
FIG. 4 is a schematic diagram of the vocal clarity compensator of FIG. 2.

A schematic diagram of the vocal clarity compensator 208 is shown in FIG. 4 and this includes a multiple feedback (MFB) band pass filter 220 and a signal amplifier 222. The MFB filter 220 includes an op-amp U100 with a negative polarity input 226, a positive polarity input 228 tied to ground, and a filter output 230. The negative polarity input 226 is electrically coupled to a compensator input 224 via capacitors C100, C102 and resistors R100, R101. The compensator input 224 is connected to the second connector 204*c* of the first switching device 204. The MFB filter 200 includes feedback resistor R102 and feedback capacitor C101 which are coupled between the filter output 230 and the negative polarity input 226.

The signal amplifier 222 includes op-amp U101 configured as an inverting amplifier. The op-amp U101 has a negative polarity input 232, a positive polarity input 234 tied to ground and an amplifier output 236 electrically coupled to the second connector 210*c* of the second switching device 210. A resistor R104 is coupled between the amplifier output 236 and the negative polarity input 232 and this together with the resistor R103 provides the gain for the inverting amplifier U101. The negative polarity input 232 is coupled to the filter output 230 of the MFB band pass filter 220 via a DC blocking capacitor C103.

The MFB band pass filter 220 is configured to be high gain and high quality factor with mid-frequency centred at a selected frequency based on the passive isolation profile of the headset 100. The mid-frequency is centred between $f_0$ and $f_1$, as shown in FIG. 3 in order to avoid the Helmholtz resonance. Table 1 tabulates the components used in the circuitry shown in FIG. 4 and their corresponding values so as to achieve the filter gain, quality factor and mid-frequency below:

Filter Gain, K=−16.7

Quality Factor, Q=8.1

Mid-frequency, $f_m$=915 Hz

TABLE 1

Components value for circuitry shown in FIG. 4

| Components | Value |
|---|---|
| R100 | 5.6 KΩ |
| R101 | 1.2 KΩ |
| R102 | 300 KΩ |
| R103 | 4.7 KΩ |
| R104 | 47 KΩ |
| C100 | 1.0 μF |
| C101 | 15 nF |
| C102 | 6.8 nF |
| C103 | 1.0 μF |

It should be appreciated that the values of various components in Table 1 are merely illustrative and should not be deemed to be limiting in any form or manner.

When the user of the headphone 100 wants to select the monitoring mode, the user selects the switches 204*a*, 210*a* accordingly so that the boosted feedback signal from the microphone amplifier 202 is now delivered to the vocal clarity compensator 208 and the ANC function of the ANC filter 206 is correspondingly disabled. This means that ambient signals or sound picked up by the microphone 112 is conveyed to the vocal clarity compensator 208 instead of the ANC filter 206. As explained above, the vocal clarity compensator 208 is configured to restore the attenuated signals caused by the passive isolation, especially the signals within the vocal band.

Figure 5:
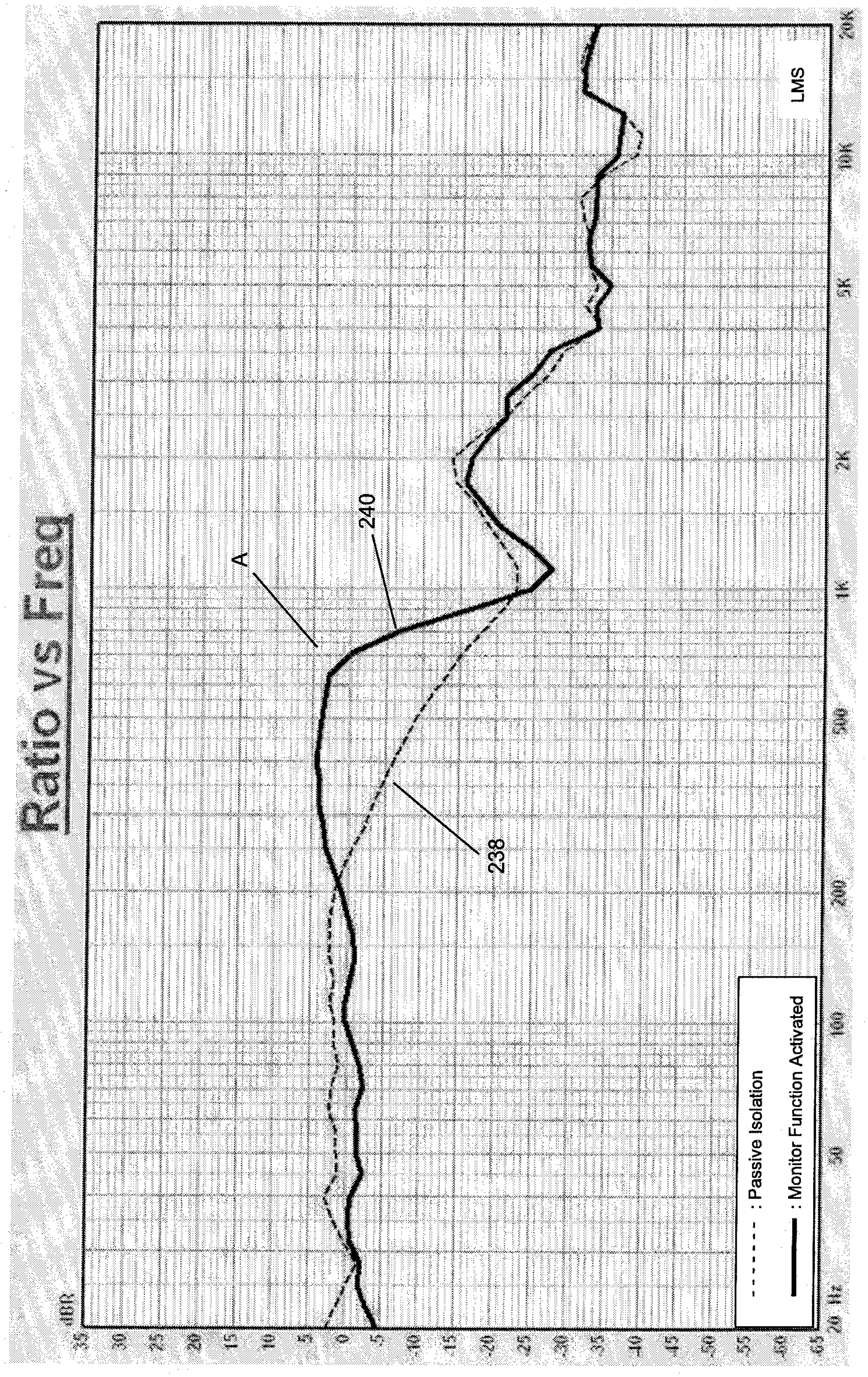
FIG. 5 is a graph showing the effects of the vocal clarity compensator of FIG. 2.

FIG. 5 is a graph showing the effects of the vocal clarity compensator 208. The graph includes a first frequency response 238 (broken lines) of a first speech signal without passing through the vocal clarity compensator 208 and it can be seen that ambient signals begin to be attenuated by the passive isolation (by the earcups 106*a*, 106*b*) from about 200 Hz onwards. The graph also includes a second frequency response 240 of a second speech signal which is passed through the vocal clarity compensator 208. Both the first and second speech signals are picked up by the microphone 112 and as it can be appreciated, the vocal clarity compensator 208 is able to boost or extend the frequency response 240 of the second speech signal between the frequencies 200 Hz and 1 KHz, and specifically, the vocal bandwidth is restored to 0 dB at about the 700 Hz mark as shown by juncture A. In this way, the vocal clarity compensator 208 is able to compensate for the attenuation by the passive isolation.

In use, when the user of the headphone 100 is listening to the audio being streamed from the audio source 218 to the earcups 102*a*, 102*b*, the switch 204*a* of the first switching device 204 and the switch 210*a* of the second switching device 210 are selected to be connected to the respective first connectors 204*b*, 210*b*. The microphone 112 picks up the ambient signals, which would mostly be the low frequency components since the high frequency components are blocked by the passive isolation provided by the ear cushion 106*a*, 106*b*. The microphone 112 then delivers the picked up ambient signals as the feedback signal to the microphone amplifier 202 and then to the ANC filter 206 so that an anti-phase signal of the feedback signal is produced to cancel out the ambient signals picked up by the microphone 112.

When the user wants to engage in a conversation or listen to the ambient sound without having to remove the headphone 100, the user selects the switch 204*a* of the first switching device 204 and the switch 210*a* of the second switching device 210 to connect to the respective second contacts 204*c*, 210*c* and the feedback signal from the microphone 112 is then delivered to the vocal clarity compensator 208, instead of the ANC filter 206. The vocal clarity compensator 208 processes the feedback signal (from the microphone amplifier 202) to boost the gain of the feedback signal so that the user is able to hear a clearer ambient sound and thus, have a more robust conversation.

Figure 6:
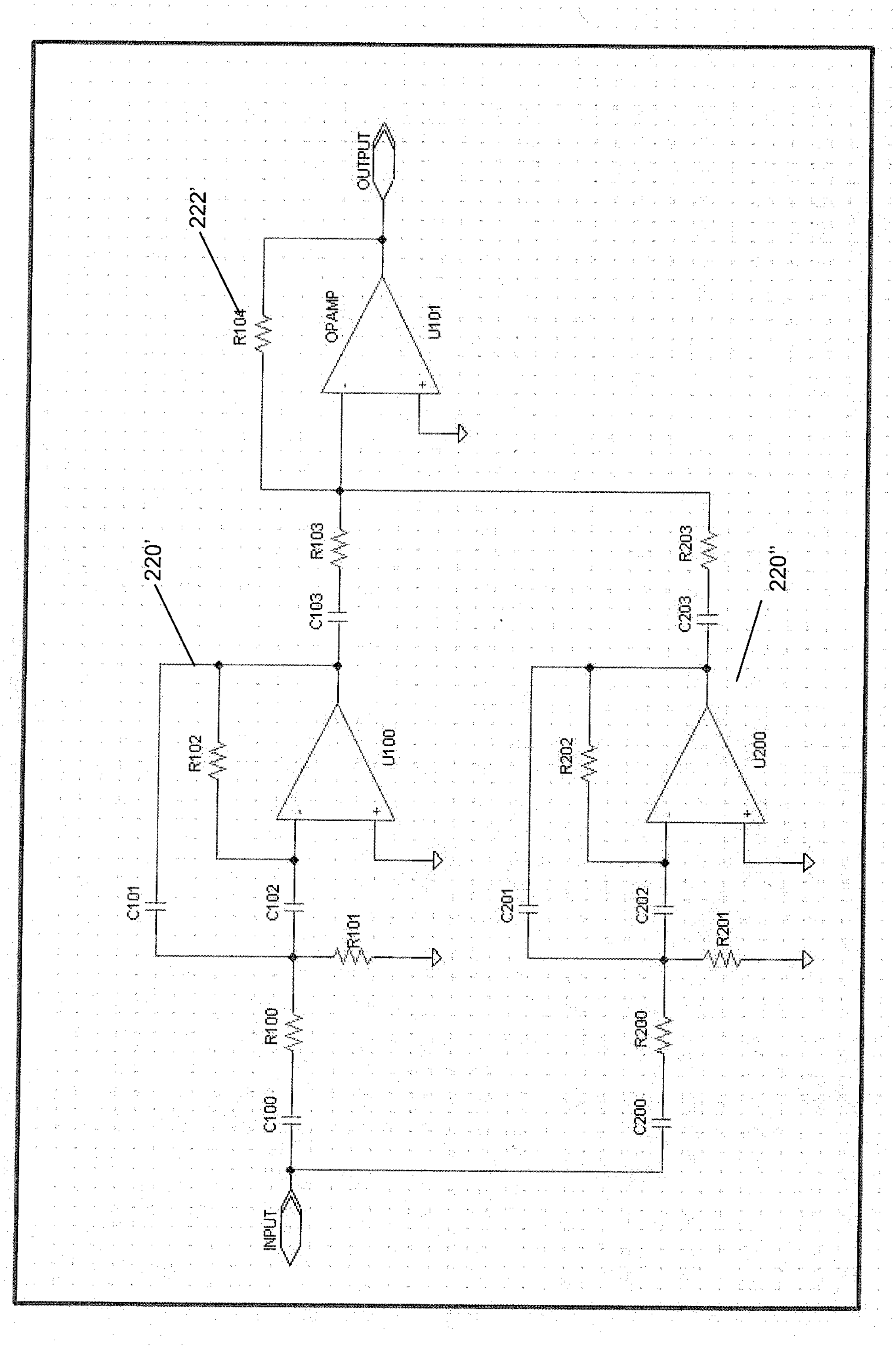
FIG. 6 is a schematic diagram of a variation of the vocal clarity compensator of FIG. 4.

As an alternative to the configuration of FIG. 4, wider vocal bandwidth may be restored if cascaded MFB bandpass filters are used and FIG. 6 shows an example. To elaborate, with reference to FIG. 6, there are two MFB filters 220', 220" of FIG. 4 cascaded in parallel with an input coupled to the second connector 204*c* of the first switching device 204. The outputs of the cascaded MFB filters 220', 220" are coupled to a signal amplifier 222' which has a similar configuration as the signal amplifier 222 of FIG. 4 and which also functions as a summer/adder. The cascaded MFB filters 220', 220" are able to provide enhance voice clarity as compared to the single filter configuration of FIG. 4.

The values of the various components of the cascaded MFB filters 220', 220" and the signal amplifier 222 are selected based on the desired effect and this would be within the knowledge of a person skilled in the art. Specifically, each band pass filter 220', 220" has its own parameters so that the mid-frequency is centred at different locations in the frequency band. In this way, the circuit design is able to compensate wider bandwidth and restore the vocal clarity. Further, when the MFB band pass filters 220', 220" are cascaded in parallel connection, each filter compensates the selected mid-frequency and even wider bandwidth may be restored.

As it can be appreciated from the described embodiment, by having the microphone 112, which is mounted or disposed near the speaker driver 108, pick up ambient sounds (both undesired ambient noise and desired ambient sound such as voice communication), this simplifies the circuitry of the active cancellation circuit 200. Depending on the mode of the active cancellation circuit 200, the ambient sound picked up is either used to create the anti-phase signal to cancel out the ambient sounds actively or used to boost the frequency response of certain components of the ambient sound. In other words, the microphone 112 actually serves a dual purpose of picking up undesired and desired ambient sounds.

The described embodiment should not be construed as limitative. For example, although it is preferred for the microphone 112 to face the ear of the user, the microphone 112 may be arranged in other positions to pick up the ambient sound, regardless of whether the sound is desired (eg. voice) or undesired ambient sound.

The vocal clarity compensator 208 is described as a band pass filter but a high pass filter is also possible. The described embodiment provides two examples of the MFB filter but it is envisaged that multiple MFB filters may be cascaded to provide enhanced voice clarity. The same applies if high pass filters are used.

The ear cushion 106*a*, 106*b* are described to be circumaural but may include other types such as intra-aural and supra-aural.

Having now fully described the invention, it should be apparent to one of ordinary skill in the art that many modifications can be made hereto without departing from the scope as claimed.

The invention claimed is:

1. A noise reduction circuit with monitoring functionality for a headphone having at least one speaker driver, the circuit comprising:

a microphone configured to convert ambient sound into a corresponding electrical ambient signal, the microphone being disposed adjacent to the speaker driver's diaphragm and within an earcup of the headphone;

an active noise reduction path configured to provide active noise reduction of the ambient sound based on the corresponding electrical ambient signal;

a vocal signal compensation path configured to restore attenuated signals within the vocal range of the corresponding electrical ambient signal to increase audibility of vocal signals of the ambient sound; and a switching device arranged to selectively deliver the corresponding electrical ambient signal to the active noise reduction path or to the vocal signal compensation path; wherein the vocal signal compensation path comprises a vocal clarity compensator configured to enhance the frequency response of the attenuated signal within the vocal range.

2. A noise reduction circuit according to claim 1, wherein the vocal clarity compensator includes a band pass filter and a signal amplifier coupled to the band pass filter's output.

3. A noise reduction circuit according to claim 1, wherein the vocal clarity compensator includes more than one band pass filter cascaded in parallel.

4. A noise reduction circuit according to claim 1, wherein the vocal clarity compensator includes a high pass filter.

5. A noise reduction circuit according to claim 1, wherein the frequency response is dependent on both construction and design of earcups of the headphone, the frequency response being between 200 Hz and 1 KHz of the vocal range.

6. A noise reduction circuit according to claim 1, further comprising a microphone amplifier arranged to amplify the corresponding electrical ambient signal, and wherein the switching device is arranged to receive the amplified corresponding electrical ambient signal.

7. A noise reduction circuit according to claim 1, wherein the active noise reduction path includes an active-noise cancellation filter.

8. A noise reduction circuit according claim 1 wherein the microphone is arranged to face the user.

9. A noise reduction circuit according to claim 1, wherein the microphone is arranged at the front of the speaker driver's diaphragm.

10. A headphone comprising the noise reduction circuit of claim 1.

11. A noise reduction circuit according to claim 1, wherein the switching device is operable by a user.

12. The noise reduction circuit as in claim 1, wherein the active noise reduction path includes an active-noise cancellation filter configured to produce a filtered noise signal.

13. The noise reduction circuit as in claim 12 further comprising:

another switching device arranged to select either the filtered noise signal from the active-noise cancelation filter or the restored attenuated signal from the vocal clarity compensator; and an adder for combining the selected filtered noise signal or the restored attenuated signal, depending on the selection of the first and second switching devices, with audio from an audio source to produce a combined signal for the at least one speaker driver.

* * * * *